United States Patent
Hamilton et al.

(10) Patent No.: US 6,891,132 B2
(45) Date of Patent: May 10, 2005

(54) SHUTTERS FOR BURN-IN-BOARD CONNECTOR OPENINGS

(75) Inventors: Harold E. Hamilton, Coon Rapids, MN (US); Chad M. Conroy, Stillwater, MN (US); Brian R. Bloch, Cedar, MN (US)

(73) Assignee: Micro Control Company, Fridley, MN (US)

( * ) Notice: Subject to any disclaimer, the term of this patent is extended or adjusted under 35 U.S.C. 154(b) by 0 days.

(21) Appl. No.: 10/682,676

(22) Filed: Oct. 9, 2003

(65) Prior Publication Data

US 2005/0077281 A1 Apr. 14, 2005

(51) Int. Cl.[7] .................................................. F24D 5/00
(52) U.S. Cl. ....................... 219/393; 324/73.1; 324/537
(58) Field of Search ................................ 219/385, 386, 219/391–394, 402, 475; 34/500, 537, 754, 760

(56) References Cited

U.S. PATENT DOCUMENTS

| | | | | |
|---|---|---|---|---|
| 4,145,620 | A | | 3/1979 | Dice .......................... 307/149 |
| 4,682,268 | A | | 7/1987 | Okano et al. ............... 361/384 |
| 4,695,707 | A | * | 9/1987 | Young ......................... 219/392 |
| 4,897,762 | A | | 1/1990 | Daikoku et al. ............ 361/382 |
| 4,912,600 | A | | 3/1990 | Jaeger et al. ............... 361/385 |
| 4,935,864 | A | | 6/1990 | Schmidt et al. ............. 363/141 |
| 5,006,796 | A | | 4/1991 | Burton et al. ........... 324/158 F |
| 5,103,168 | A | | 4/1992 | Fuoco ......................... 324/158 |
| 5,270,572 | A | | 12/1993 | Nakajima et al. ........... 257/714 |
| 5,277,594 | A | | 1/1994 | Matsuoka et al. ........... 439/172 |
| 5,361,188 | A | | 11/1994 | Kondou et al. ............. 361/695 |
| 5,428,503 | A | | 6/1995 | Matsushima et al. ....... 361/695 |
| 5,515,910 | A | | 5/1996 | Hamilton et al. ............. 165/30 |
| 5,544,012 | A | | 8/1996 | Koike ......................... 361/695 |
| 5,579,826 | A | | 12/1996 | Hamilton et al. ........... 165/254 |
| 5,582,235 | A | | 12/1996 | Hamilton et al. ........... 165/263 |
| 5,807,104 | A | | 9/1998 | Ikeya et al. ................... 439/73 |
| 5,889,651 | A | | 3/1999 | Sasaki et al. ............... 361/699 |
| 5,923,179 | A | | 7/1999 | Taylor ......................... 324/755 |
| 5,952,842 | A | | 9/1999 | Fujimoto .................... 324/760 |
| 5,978,218 | A | | 11/1999 | Fujimoto et al. ........... 361/696 |
| 6,043,980 | A | | 3/2000 | Katsui ......................... 361/695 |
| 6,100,706 | A | | 8/2000 | Hamilton et al. ........... 324/760 |
| 6,144,215 | A | | 11/2000 | Maxwell et al. ............ 324/765 |
| 6,175,498 | B1 | | 1/2001 | Conroy et al. .............. 361/704 |
| 6,213,806 | B1 | | 4/2001 | Choy .......................... 439/331 |

* cited by examiner

Primary Examiner—Thor Campbell
(74) Attorney, Agent, or Firm—Westman, Champlin & Kelly, P.A.

(57) ABSTRACT

A burn-in oven is provided with a wall that has a number of vertically stacked, laterally extending slots aligned with each of the burn-in-board supports in the oven. When a burn-in-board is placed in the oven on the supports, an edge portion of the burn-in-board extends through a slot into a connector area. Each of the slots has a shutter associated therewith that will move from an open position to permit the burn-in-board connector portion to extend through the slot, to a closed position wherein the shutter covers the slot. A cam operator moves the shutters to a closed position, except when a burn-in-board is extending through a particular slot, it will support the shutter in its open position and the shutter will not be moved by the cam. All the shutters associated with openings through which no burn-in-board connector portion extends will be closed to prevent air flow from the burn-in oven.

14 Claims, 5 Drawing Sheets

SHUTTERS FOR BURN-IN-BOARD CONNECTOR OPENINGS

BACKGROUND OF THE INVENTION

The present invention relates to use of shutters or doors on the side rear of a burn-in oven that will cover the slots through connector portions of burn-in-boards for coupling to test circuits. All end connector portion of the board protrudes out of the oven, for connection of the test circuits to power and to carry signals indicating the temperature and other characteristics of the integrated circuits on such boards. The shutters or doors cover burn-in-board slots that are not being used so heat from the oven does not escape, and air flow is also controlled.

The use of burn-in-boards for testing integrated circuits and circuit packages has advanced over the years. The burn-in ovens that are in use will support a number of individual boards, with each board having a substantial number of individual integrated circuits for testing. These boards usually have one end or edge that is provided with connector portions that are electrically connected to mating connector portions leading to driver/receiver board that will control the power to the individual circuits, as well as receiving test information from the circuits and temperature signals for controlling the environment in which the circuits are tested.

U.S. Pat. No. 4,900,948 shows an environmental system for testing individual burn-inboards. At the present time, more forced air cooling has become desirable because of the increased power requirements of the circuits and the consequent heat that is evolved. Higher operating temperatures also are accommodated by the more recent ovens.

Generally speaking, the burn-in-boards are oriented horizontally, but have edges that extend through slots to the exterior to connect to suitable connectors for voltage regulator, driver/receiver boards or circuits.

One aspect of use in a multiple board oven is that the slots that provide openings for the contact ends of individual burn-in-boards may not all be used during a test sequence, and its desirable to close off air flow and reduce heat transfer from the heated enclosure into the connector area or portions of the burn-in oven.

SUMMARY OF THE INVENTION

The present invention relates to a burn-in oven that has a wall provided with slots that open between the interior of the oven, and a connector region. The connectors at the edge of the burn-in-boards can be passed to the exterior of the oven, and connected to driver/receiver boards or directly to other controls in a cool environment. The burn-inboards are provided with sealing or blocks that have surfaces to seal around the slots. Gaskets are used for insuring that air flow does not pass from the interior of the oven out through the slots when there is a burn-in-board installed.

In an oven with a large number of vertically stacked guides for burn-in-boards and slots, not all of the slots of the oven will be occupied for each test. Many times the circuits being tested will be fewer than the capacity of the oven, and the driver/receiver boards for such slots are desirably left unconnected.

The present invention provides shutters or doors, one for each burn-in-board slot, that will close all of the burn-in-board connector slots that are not in use. As shown, there are air control trays with air slots or valves above each burn-in-board. All of such trays that can be installed in an oven are installed, to close the oven wall slots for the trays with seal bars. The tray slots or valves regulate air flow to the burn-in-boards in use.

The closing of the burn-in-board connector slots insures that hot air from the interior of the oven will not be exhausted into the connector region, and the temperature in the connector region can be maintained substantially lower than that of the oven.

An actuator system will open all of the shutters or doors simultaneously and it includes sliding actuators that have cams that are engaged by cam followers on the shutters to operate the hinged shutters or doors. After the shutters have been opened, the burn-in-boards are inserted into the oven, with the connector section on the burn-in-board extending out through a slot. The shutter for the occupied slot will be held open by a portion of the connector section. After all of the burn-in-boards that are being tested have been inserted, the actuator system and sliding actuator members will be reversed and the cams will close the shutters or doors for slots through which there are no burn-in-board connectors. The cams are designed so the cam followers on the shutters being held open by inserted burn-in-boards will not engage the respective cam during the reverse movement of the sliding actuator members.

This insures that the control of the environment in the oven for the circuits being tested will be easier, and that the connector region or chamber will not be subjected to the high internal temperatures of the burn-in oven.

DETAILED DESCRIPTION OF THE PREFERRED EMBODIMENTS

Figure 1:
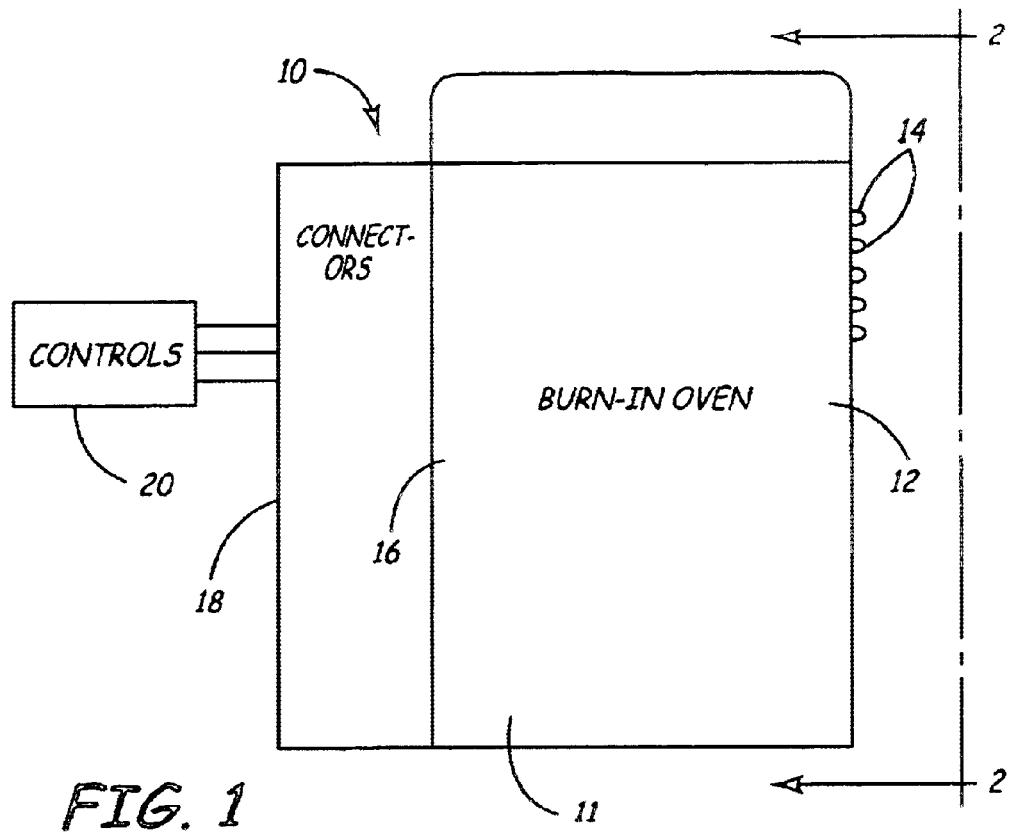
FIG. 1 is a schematic side view of a burn-in oven and a connector housing of typical design with which the present invention will work.

In FIG. 1, a burn-in oven indicated generally at 10 is an enclosure 11 that has insulated side walls, and a front wall 12 having a door through which burn-in-boards, and also air flow control fan trays or boards can be inserted and held in place with suitable latch handles 14. Rear wall 16 of the burn-in-board oven has a schematically shown connector housing 18 for driver/receiver boards and connectors between the burn-in-boards and the driver/receiver boards, for housing connectors from the burn-in-boards to signal carrying leads leading to remote locations. Also, connections for air flow valve controls are made in this connector housing 18.

The housing 18 is supported at the rear wall 16, and access to the interior of the housing 18 is provided for connecting the connectors used on the burn-in-boards and fan boards. A controller 20, such as a PC or other form of computer or processor, is connected into the system.

Figure 2:
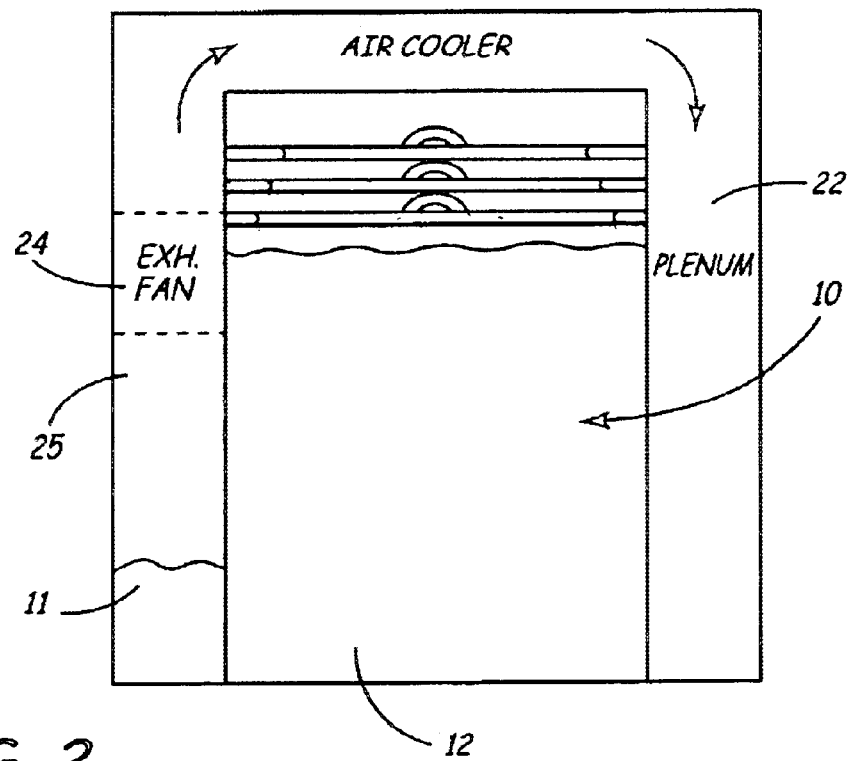
FIG. 2 is an end view taken on line 2—2 in FIG. 1 to illustrate an exhaust fan, air cooler and chamber for supplying cooling air to the interior of the burn-in oven.

FIG. 2, schematically shows the burn-in oven enclosure 11 with details removed, with the oven access door closed, and illustrating that a cooling air supply plenum 22 can be mounted on one side wall of the burn-in oven 10, and can provide air flow to the interior of the burn-in oven. An exhaust fan or fans 24 in a plenum 25 on an opposite side of the burn-in oven will draw air through the burn-in oven, as shown, for example, in U.S. patent application Ser. No. 10/020,348, filed Dec. 12, 2001, which is incorporated by reference. The cooling air flow onto circuits comprising devices under test (DUTS) in the present application is controlled by providing boards with valves that will direct air onto circuits on burn-in-boards located below the valves, and then exhausted out through the exhaust plenum 25 using fan 24 for air circulation. The temperature can be controlled in response to measured temperatures at each of the circuits or DUTS.

In the present invention it is desirable to retain the connector housing 18, and the connectors that are mounted therein at a much lower temperature than that which is needed in the burn-in oven.

Figure 3:
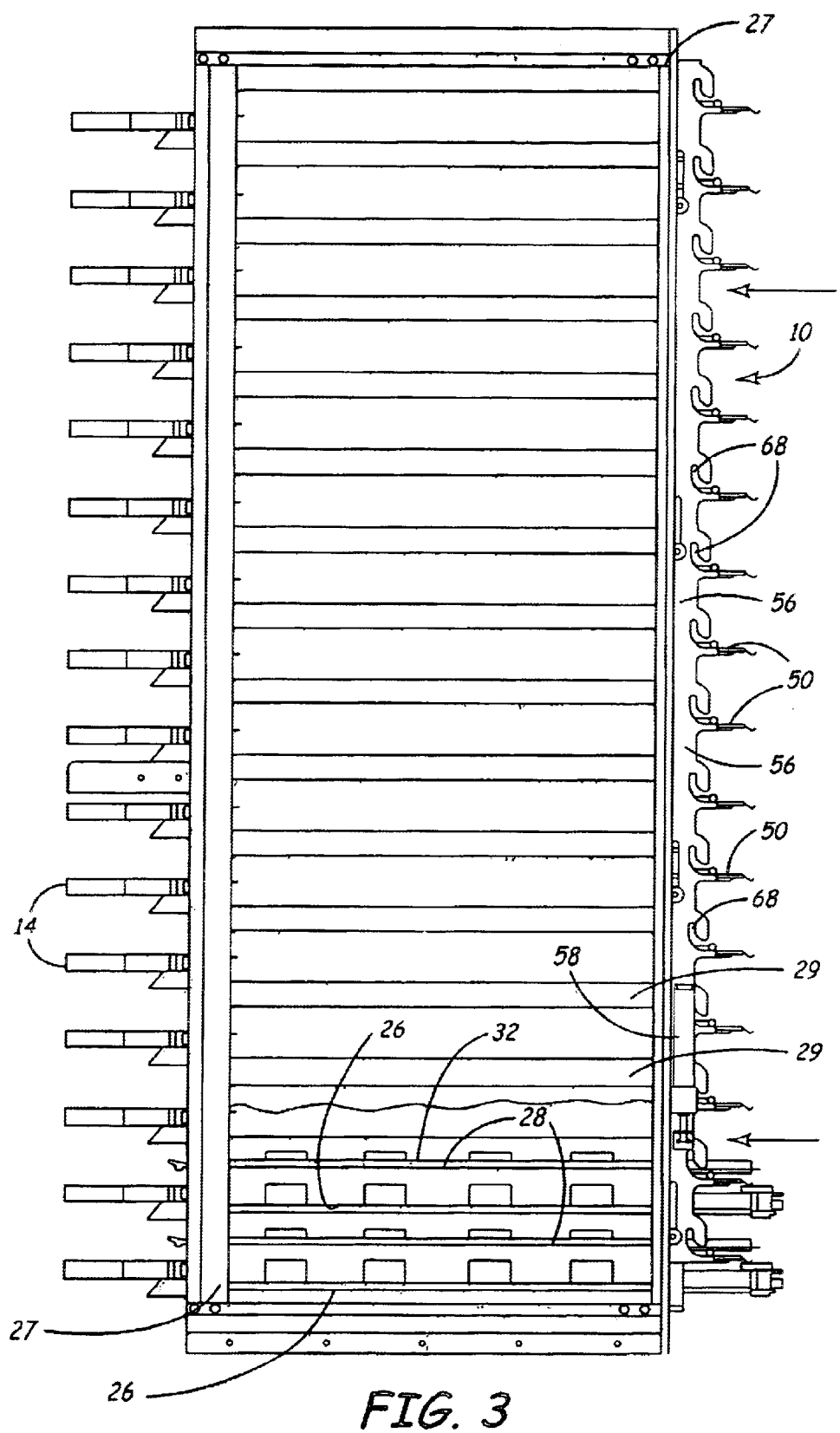
FIG. 3 is a schematic side view of a burn-in oven with the outer walls removed and showing the shutters for burn-in-board connector slots all in an open position.

Referring to FIG. 3, it can be seen that the burn-in oven interior comprises a rack or frame 27 that has a series of tracks or supports 26 thereon, which will support burn-in-boards 30. Interspersed between the tracks 26 are tracks 28 that are used for supporting, as shown, control valve trays 32. Air flow down onto the circuits being tested (DUTS) on the burn-in-board below each valve tray is controlled, and air flow is exhausted to the exhaust plenum. The cool incoming air flow is through the slots 29 shown in FIG. 3 that align with chambers above each valve board. Thus, the air flow normally would be perpendicular to the plane of the paper on which FIG. 3 is drawn.

FIGS. 3–6 show a lower burn-in-board 30 that is supported on a set of rails or supports 26, and above this burn-in-board is a valve tray 32 that is supported on rails or supports 28. The valve tray or board 32 has valves 34 that control the air flow from a chamber above the burn-in-board onto circuit assemblies or DUTS 36 positioned below the valves.

Each of the DUTS 36 has a number of individual leads or connectors that are provided along the burn-in-board and which exit at a connector block end 40 that protrudes outside the burn-in oven frame, and which has pin connectors 42 (see FIGS. 4, 5, and 6) that are connected to suitable connectors 43 for driver/receiver boards or to other controls or devices.

Figure 4:
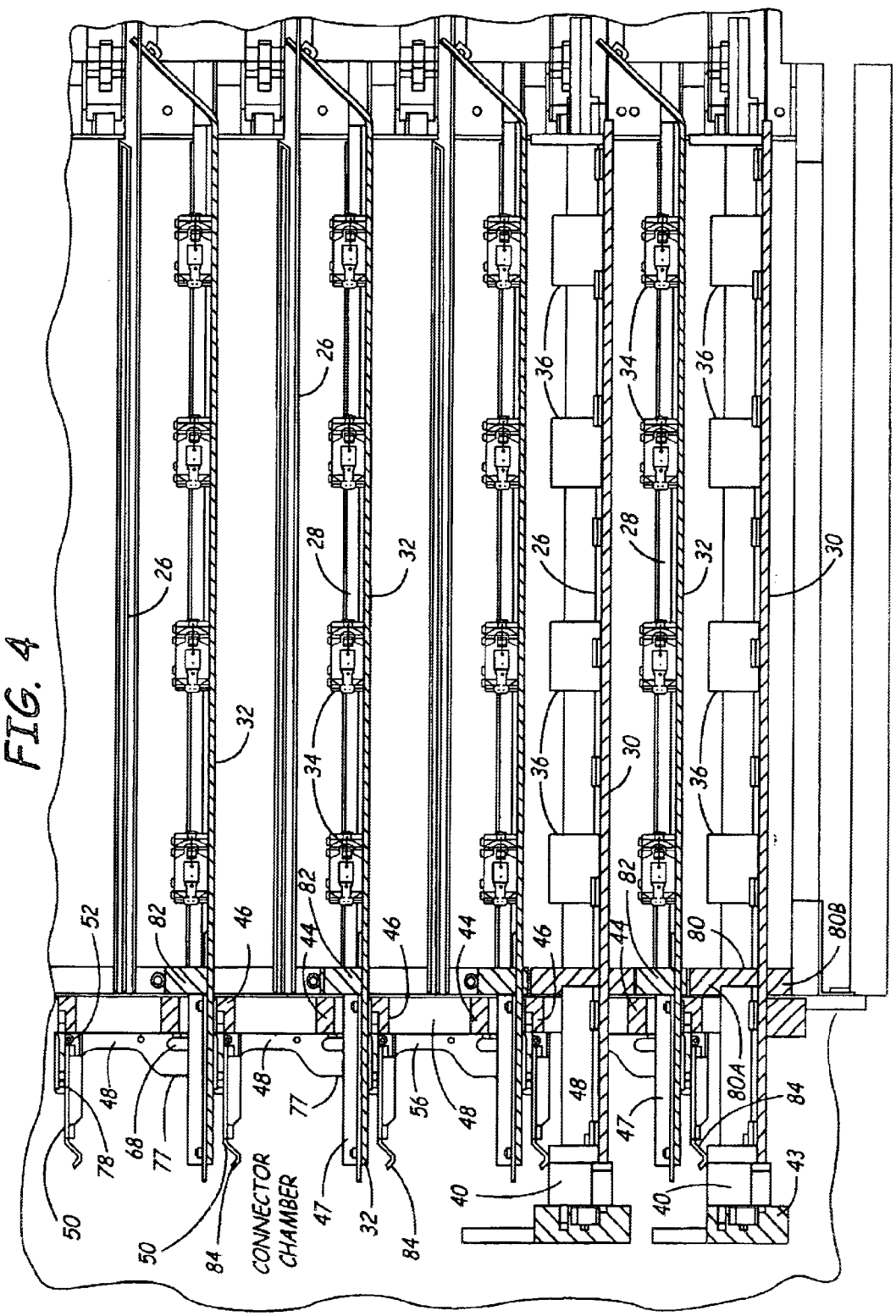
FIG. 4 is an enlarged sectional view taken from an opposite side of the oven from FIG. 3 showing the shutters in an open position, and the shutter actuators raised, with a pair of burn-inboards in position.

FIG. 4 is a fragmentary enlarged sectional view of the lower portions of FIG. 3 illustrates the frame 24 on the interior of the burn-in oven, with the rails or supports 26 and 28 shown. The integrated circuits shown at 36 are positioned on the burn-in-boards, and the flow control valves 36 are on the valve tray or boards 32. The valves 34 are on valve trays or boards above the respective burn-in-board 30.

Figure 5:
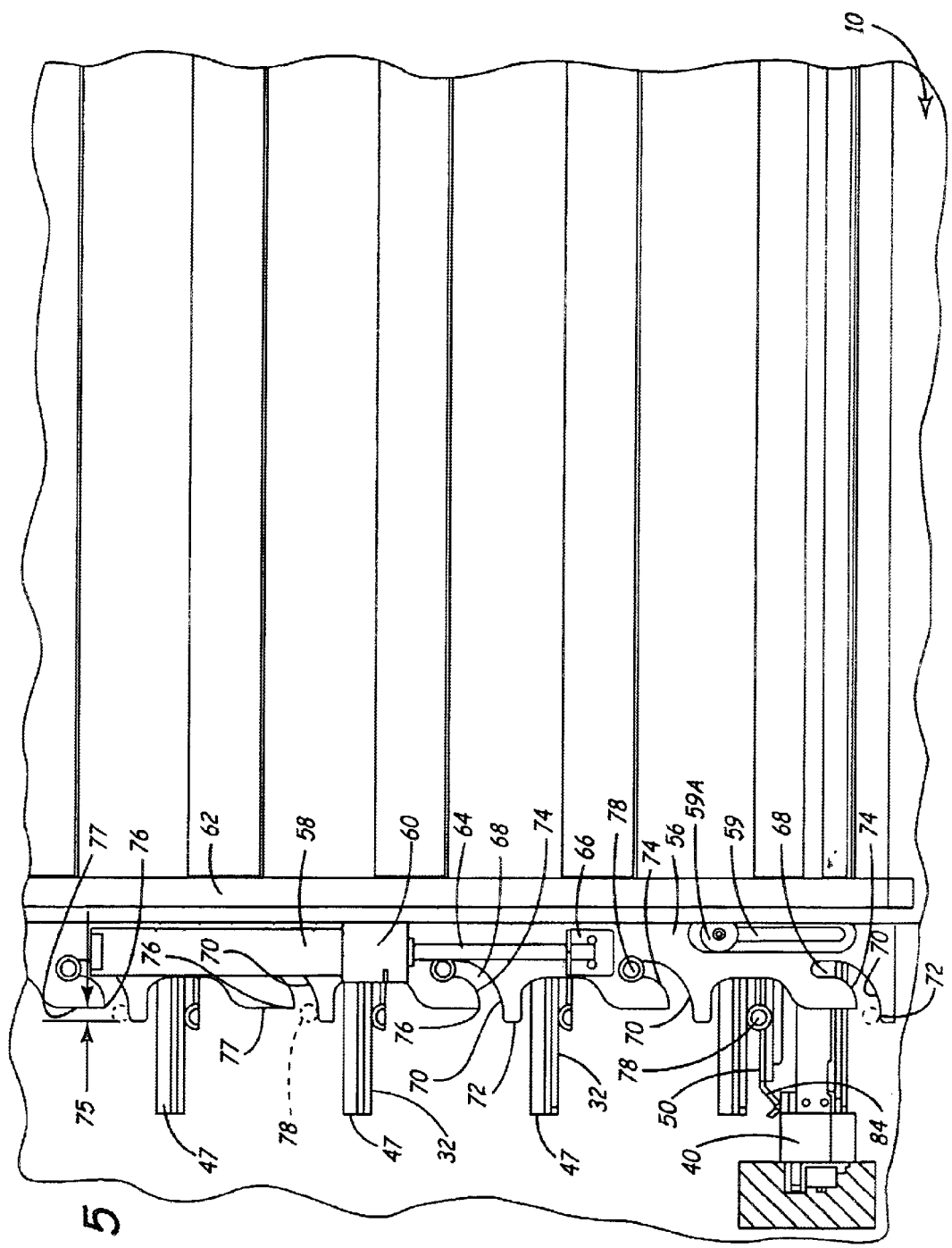
FIG. 5 is a side view with the actuators for the shutters moved to close the shutter for burn-in-board connector slots where no burn-in-board is in place.
Figure 6:
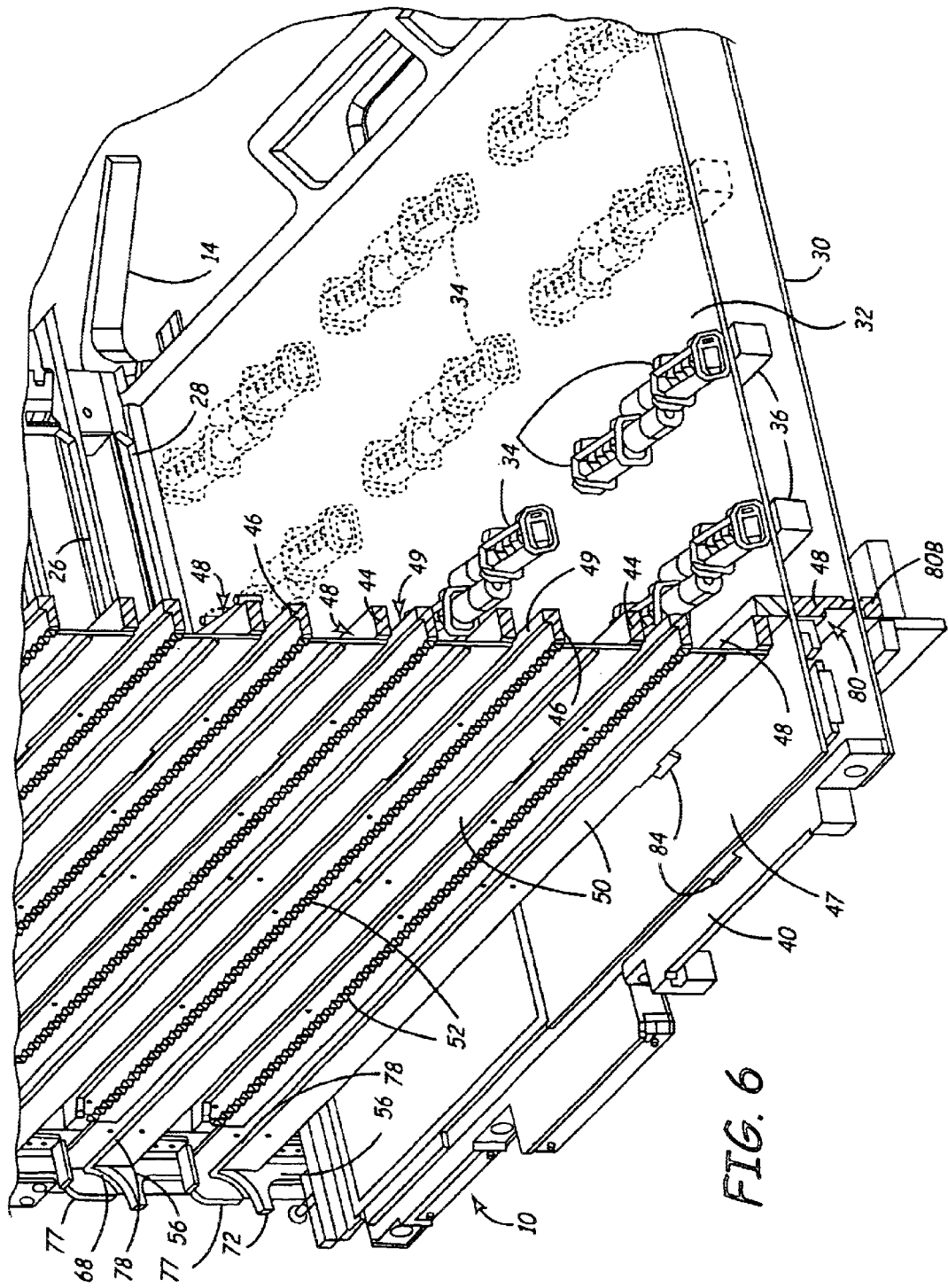
FIG. 6 is an enlarged, fragmentary perspective view of a portion of a burn-in oven showing the shutter in the position shown in FIG. 5 and with only one valve tray shown.

As perhaps can be best seen in FIGS. 4, 5, and 6, the rear wall of the burn-in oven is provided with a series of cross members 44 and cross support bars 46 that are spaced apart to form burn-in-board connector end openings 48 between each cross member 44 and the higher cross support bar 46. An opening 49 is formed between each cross member 44 and the next lower cross support bar 46. The openings 48 are stacked one above another, and each opening 48 receives a connector end 40 of a burn-in-board that passes into the connector housing 18. End portions 47 of valve trays or boards also pass through the openings 49 into the connector chamber. The burn-inboards and valve boards carry blocks to close the respective openings when the boards are installed.

There are shutters or doors 50 that are hinged on the cross support bars 46 and extend all the way across the end wall of the burn-in-oven. The shutters 50 are of size so that when they are closed, as shown in FIGS. 5 and 6, the shutters 50 cover the opening 48 between the respective cross support bar 46 and the next lower cross member 44 that define the connector opening 48 for the burn-in-boards. The openings 48 extend laterally across the side of the frame 24. As can be seen in FIG. 6, each of the shutters 50 has a hinge 52 that attaches the door to the cross support bar 46 above each of the respective openings 48 that is covered by the shutter 50 hinged to that rail.

Pivoting of the shutters 50 to the open position shown in FIG. 4, and to a closed position for the shutters 50 above the openings 48 in which no burn-in-board is placed, is controlled by a pair of sliding actuator or cam plates 56, one positioned on each of the opposite sides of the burn-in-oven frame.

As shown in FIG. 5, where the cam plate 56 is shown in a shutter closing position, sliding movement of the actuator or cam plates 56 is controlled by a pair of actuators 58, one on each side of the frame 24, and each of which is fastened with a suitable bracket 60 to an upright post 62 forming the frame 24. The actuators 58 are identical, and each has an extendable and retractable rod 64 connected through a bracket 66 to the respective actuator or cam plate on opposite sides of the frame 24. FIG. 3 shows one actuator 58 retracted in position to lift the actuator or cam plates 56 upwardly, and cause the shutters 50 to be moved to the open position. The actuator or cam plates are provided with one or more guide slots 59 in which a headed retainer pin 59A will slide.

The actuator or cam plates 56 are provided with cam tracks 68, one associated with each of the shutters 50, and thus each set of cam tracks 68 controls the opening and closing of one of the shutters 50. Each cam track 68 is formed with a lower curved cam track surface 70 that extends out along a finger 72, and a shorter, upper cam track surface 74 that terminates at a corner 76 that is spaced inwardly (see FIG. 5) toward the frame from the end of the finger 72 as shown by spacing 75. Each of the shutters in turn has a control or cam follower rod shown at 78 that has cam follower ends which are positioned in the cam tracks 68 for that shutter. When the actuators 58 are retracted, as shown in FIG. 3, the shutters 50 will be lifted or opened, and the followers 78 will be guided along the cam surface 70 all the way out to the end of the finger 72. This is shown in dotted lines in two places in FIG. 5.

The operations of the oven requires that all of the valve boards that can be held in the tracks 28 are installed. Thus, a connector end 47 extend through every slot or opening 49 at all times of testing. The burn-in-boards 30 are always associated with a valve board 32 to control cooling flow through the openings controlled by the valves 34 on the valve board down to the circuit components 36 below them. When a burn-in-board 32 is inserted into the frame 24, the connector end 40 extends through the aligning opening 48 for that burn-in-board to the exterior of the frame 24, as shown in FIGS. 3, 4 and 5, as well as in the lower portion of FIG. 6. When the burn-in-board is properly seated so that the latches 14 can be closed, a seal plate 80 engages the cross members above and below the respective opening 48 to seal the opening. The seal plate 80 is carried by the burn-in-board and is perpendicular to the plane of the burn-in-board. The seal plate 80 extends both above and below the burn-in-board as shown in FIG. 4. The seal plate 80 has an upper portion 80A that rests and seals against the cross member 46 defining that particular opening 48, as shown in FIG. 4, and the seal plate 80 has a lower portion 80B that seals against the lower cross bar 44 defining that opening 48. The openings 49, which are formed below the cross members 44, but above the next lower cross support bar 46, and in which a valve board 32 is always placed are sealed or closed with a seal block or rail 82 carried on each valve board that will close off the respective opening 49. The connector 47 portion of the valve board extends out of the slot formed by opening 49.

As can be seen in FIG. 4 where there are two burn-in-boards and four valve boards shown installed, the slots in openings at the connector ends of the two burn-in-boards are blocked. Also, the shutter 50 for the opening through which the burn-in-board extends is held open on the upper surface of the connector block 40 for that burn-in-board. A spring clip 84 is provided at the lower edge of each of the shutters 50, and the spring clip will rest on the top surface of the connector block 40 of an installed burn-in-board so that the shutter 50 is propped open.

Assuming that the desired number of burn-in-boards have been put into position in the burn-in oven frame, and that testing is to occur, the actuators 58 are extended, and the shutters or doors 50 that are supported on the valve block 40 of an inserted burn-in-board are held in their open position. The cam follower end of the rods 78 for each shutter held open will clear the corner 76 and the outer edge 77 of a portion of the actuator or cam plates 56 defining the cam track 74 for that shutter or door (see FIG. 5). When the cam plate 57 is moved down, each shutter or door 50 that is supported on the connectors of a burn-in-board will remain in its raised position. The openings 48, through which a connector end 40 of a burn-in-board extends, will be sealed by the seal block 80 on the burn-in-board. The openings 49 are all closed by the seal plate 82 that are carried by the valve boards.

The rest of the shutters 50 for openings where no burn-in-board is installed will be cammed shut by the cam tracks 68, as the cam plates 56 are lowered. The cam actuator ends of the rods 78 will be moved along the cam tracks 68 to the positions shown in FIG. 5 when the rods 64 of the actuators 58 are extended.

This will lock the shutters 50 for unused connection slots or openings 48 in their closed positions as shown in FIG. 6.

The connectors for the burn-in-boards can be maintained at a temperature that is substantially lower than that in the burn-in oven because of the blocking of air flow out into the connector housing. The air flow path will be controlled by the valves on the valve boards because the air flow out through the connector openings is blocked by the shutters 50 where there are no burn-in-boards, and by the burn-in-board seal blocks where there are burn-in-boards installed. The openings 49 are closed by valve board seal plates.

The input side of the oven is closed with an oven door after the latches 14 have been put into position for holding the burn-in-boards and valve boards securely.

Although the present invention has been described with reference to preferred embodiments, workers skilled in the art will recognize that changes may be made in form and detail without departing from the spirit and scope of the invention.

What is claimed is:

1. A burn-in oven having a heated chamber, a plurality of stacked supports for burn-in-boards, a connector area along an exterior side of the burn-in oven chamber, a wall between the connector area and the burn-in oven chamber having a plurality of connector slots defined therethrough, each of the burn-in-boards in the burn-in oven chamber having a portion that extends through an associated connector slot to the connector, a plurality of shutters, one for each of the connector slots hingedly attached to the wall adjacent to one of the connector slots and moveable from a position wherein it covers an associated connector slot to a position wherein the portion of the burn-in-board can extend through such connector slot with the shutter in an open position, each of the burn-in-board portions having a support for engaging and holding a shutter in an open position when the burn-in-board portion extends through such connector slot, and an actuator for moving the shutters from open to a closed positions, said actuator being disengaged from closing shutters engaged by a support on the portion of a burn-in-board.

2. The burn-in oven of claim 1, wherein the connector slots extend laterally to receive the portions of burn-in-boards, and the shutters being hinged along an axis parallel to a plane of burn-in-boards supported in the burn-in oven chamber.

3. The burn-in oven of claim 1, wherein said actuator comprises a pair of cam plates, one on each of opposite ends of the shutters, said cam plates having cam slots formed therein, cam followers on the shutters comprising projecting end portions from each end of the shutters, and the projecting end portions riding in the cam slots, the cam plates having a recessed portion at an outer end such that the cam followers will clear the cam slot when positioned aligned with the recessed portion and held by the support portion of a burn-in-board to disengage such cam follower from the cam slot.

4. The burn-in oven of claim 1, wherein each burn-in-board carries first seal blocks to seal on a periphery of a respective connector slot when installed in an oven chamber.

5. The burn-in oven of claim 4, wherein the wall has separate second slots between the connector slots for receiving end portions of second boards in the burn-in oven chamber, each of the second boards having second seal blocks carried thereon that engage peripheral portions of the second slots to prevent air flow out such second slots.

6. The burn-in oven of claim 1, wherein said burn-in-boards have seal blocks mounted thereon and extending laterally across the burn-in-boards, said seal blocks having portions that engage peripheral portions of surfaces surrounding said slots to seal air flow from flowing through said slots, when the connector portions of the burn-in-boards are extending through the respective slots.

7. A burn-in oven for supporting a plurality of burn-in-boards, said oven having a plurality of burn-in-board supports along a length of the burn-in oven, a separate opening on one wall of the burn-in oven associated with each of the burn-in-board supports to provide an opening for a connector portion of a burn-in-board mounted on an associated support to extend through the opening to a connector area, and a plurality of shutters, one for each of the openings that is moveable from a position clearing the opening to a position covering the opening, an actuator for moving the shutters from an open position to a covering position, and each of the connector portions supporting a shutter in an open position regardless of the position of the actuator.

8. The burn-in oven of claim 7, wherein said shutters are operated by an actuator comprising cams mounted on the burn-in oven and moveable between two positions, cam followers on each of the shutters associated with the cams, said shutters being maintained in a position clearing the cams when supported on the connector portions of a burn-in-board.

9. The burn-in oven of claim 7, wherein each burn-in-board has a seal block supported thereon and extending generally perpendicular to a plane of the burn-in-board, said seal block engaging portions of surfaces defining an opening for such burn-in-board to provide an air seal from the interior of the burn-in oven.

10. The burn-in oven of claim 8, wherein the actuator comprises a power actuator for moving the cams between their two positions.

11. The burn-in oven of claim 8, wherein said cams comprise sliding plates having a plurality of cam tracks defined therein, said cam tracks being configured to move the shutters between the open and closed positions when the sliding plates are moved, said cam tracks having a support portion for supporting the shutters in an open position, said support portion extending outwardly from a mating surface of the respective cam track and providing a support for the shutters held under gravity on the outwardly extending support portion, a cam follower supported on said outwardly extending support portion clearing the cam track when such cam follower is held in its open position by a support other than the cam track, to permit the shutter to be held in such open position while others shutters are moved to their closed positions.

12. A burn-in oven having a plurality of supports for burn-in-boards, each burn-in-board having a connector edge portion, the burn-in-board oven having a wall with a plurality of openings, one for each of the burn-in-boards to permit protrusion of an edge connector on a connector edge portion of a burn-in-board to extend through the opening, each of the openings having a separate shutter hingedly attached relative thereto, and moveable from a position covering the opening to an open position, each shutter being supportable on the edge connector mounted on the connector portion of a burn-in-board extending through the opening associated with such shutter, and a shutter closing mechanism for closing the shutters to move the shutters to a closed position operable only when the shutter is not supported on an edge connector of a burn-in-board.

13. The burn-in oven of claim 12, wherein the shutter closing mechanism comprises a powered operator.

14. The burn-in oven of claim 13, wherein said powered operator comprises sliding cams mounted on the burn-in oven, said sliding cams having slot cam tracks formed therein, cam follower rods on each of the shutters associated with a cam track, said sliding cams having a protruding finger extending from an open end of the slot cam tracks to support the cam followers on the exterior of the slot cam track when the shutters are in an open position, said connector edge portions of burn-in-boards installed in the oven holding the shutters in an open position with a cam follower on such shutter on the protruding finger portion of the associated sliding cam, and when in such open position, the cam followers being clear of the cam slot tracks when the sliding cams are moved to close the shutters.

* * * * *

UNITED STATES PATENT AND TRADEMARK OFFICE
CERTIFICATE OF CORRECTION

PATENT NO. : 6,891,132 B2
DATED : May 10, 2005
INVENTOR(S) : Hamilton et al.

It is certified that error appears in the above-identified patent and that said Letters Patent is hereby corrected as shown below:

Column 7,
Line 30, "others" should be -- other --.

Signed and Sealed this

Thirteenth Day of December, 2005

JON W. DUDAS
*Director of the United States Patent and Trademark Office*